(12) United States Patent
Lin

(10) Patent No.: US 9,609,784 B2
(45) Date of Patent: Mar. 28, 2017

(54) CONTAINER DATA CENTER

(71) Applicant: HON HAI PRECISION INDUSTRY CO., LTD., New Taipei (TW)

(72) Inventor: Tai-Wei Lin, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 1035 days.

(21) Appl. No.: 13/846,926

(22) Filed: Mar. 18, 2013

(65) Prior Publication Data

US 2014/0199934 A1 Jul. 17, 2014

(30) Foreign Application Priority Data

Jan. 17, 2013 (TW) ................................ 102101836

(51) Int. Cl.
| | | |
|---|---|---|
| *H05K 7/14* | (2006.01) | |
| *H05K 7/20* | (2006.01) | |
| *E04B 1/343* | (2006.01) | |
| *E04H 1/12* | (2006.01) | |

(52) U.S. Cl.
CPC ....... *H05K 7/1497* (2013.01); *H05K 7/20745* (2013.01); *E04B 1/343* (2013.01); *E04H 2001/1283* (2013.01)

(58) Field of Classification Search
CPC .... H05K 7/1497; H05K 7/20745; E04H 1/00; E04B 1/343; F24D 23/01
USPC ............................................. 454/184, 63–67
See application file for complete search history.

(56) References Cited

U.S. PATENT DOCUMENTS

| | | | | |
|---|---|---|---|---|
| 2,778,206 A | * | 1/1957 | Wilson ............... | B61D 27/0027 62/237 |
| 4,357,860 A | * | 11/1982 | Krzak ..................... | B64F 1/305 138/120 |
| 4,543,677 A | * | 10/1985 | Haglund ................. | B64F 1/305 138/120 |
| 4,598,555 A | * | 7/1986 | Windecker ............... | A23B 7/04 62/239 |
| 4,934,255 A | * | 6/1990 | McDonnell ............... | B60P 3/20 236/44 C |
| 5,096,230 A | * | 3/1992 | Pausch .................... | B08B 15/00 285/304 |
| 5,564,287 A | * | 10/1996 | Hearne, Jr. ........ | B61D 27/0081 62/237 |

(Continued)

FOREIGN PATENT DOCUMENTS

| | | | | |
|---|---|---|---|---|
| CN | 201858738 U | 6/2011 | | |
| DE | 102014002497 A1 | * 8/2014 | ............ | B60P 1/6463 |

(Continued)

*Primary Examiner* — Alissa Tompkins
*Assistant Examiner* — Frances F Hamilton
(74) *Attorney, Agent, or Firm* — Zhigang Ma

(57) ABSTRACT

A container data center includes a container, an air duct, and a connecting member. The container is received in a room. The container defines an air inlet and an air outlet away from the air inlet. The air duct extends through a sidewall of the room. A first side of the connecting member is detachably connected to the air inlet of the container, and a second side of the connecting member is connected to the air duct. Air outside the room enters the air duct, flows through the connecting member, enters the container through the air inlet, and flows out of the container through the air outlet.

7 Claims, 5 Drawing Sheets

(56) References Cited

U.S. PATENT DOCUMENTS

| | | | | |
|---|---|---|---|---|
| 5,911,623 | A * | 6/1999 | Trana | B08B 15/002 138/89 |
| 7,511,959 | B2 * | 3/2009 | Belady | G06F 1/18 165/104.33 |
| 7,724,513 | B2 * | 5/2010 | Coglitore | H05K 7/20745 165/104.33 |
| 8,074,403 | B1 * | 12/2011 | Mentnech | E04B 1/343 296/165 |
| 8,218,322 | B2 * | 7/2012 | Clidaras | G06F 1/20 165/80.4 |
| 8,251,785 | B2 * | 8/2012 | Schmitt | H05K 7/1497 361/695 |
| 8,310,829 | B2 * | 11/2012 | Monk | F24F 11/0001 361/694 |
| 8,444,919 | B2 * | 5/2013 | Erickson | A01N 25/06 422/27 |
| 8,514,572 | B2 * | 8/2013 | Rogers | H05K 7/20745 165/287 |
| 8,549,869 | B1 * | 10/2013 | Whitted | G06F 1/16 165/104.33 |
| 8,740,099 | B2 * | 6/2014 | Gibbons | G05D 27/02 236/44 C |
| 8,743,543 | B2 * | 6/2014 | Clidaras | G06F 1/20 165/80.4 |
| 8,845,406 | B2 * | 9/2014 | McIver | F24F 7/02 454/367 |
| 8,988,879 | B2 * | 3/2015 | Hamburgen | H05K 7/2079 165/104.22 |
| 9,004,306 | B2 * | 4/2015 | Platt | B09B 3/0016 220/1.5 |
| 9,101,080 | B2 * | 8/2015 | Czamara | H05K 7/1497 |
| 9,144,172 | B2 * | 9/2015 | Bergthold | H05K 7/1457 |
| 9,258,930 | B2 * | 2/2016 | Gardner | H05K 7/1497 |
| 9,310,855 | B2 * | 4/2016 | Godrich | G06F 1/20 |
| 9,332,678 | B2 * | 5/2016 | Rodriguez | H05K 7/20745 |
| 2006/0082263 | A1 * | 4/2006 | Rimler | B60P 3/14 312/201 |
| 2006/0230704 | A1 * | 10/2006 | Lambreth | E04B 1/34 52/745.02 |
| 2008/0178537 | A1 * | 7/2008 | Spangler | B23P 21/00 52/36.1 |
| 2009/0093182 | A1 * | 4/2009 | Jacobs | A63H 33/008 446/120 |
| 2010/0087957 | A1 * | 4/2010 | Gibbons | G05D 27/02 700/276 |
| 2011/0065370 | A1 * | 3/2011 | Reid | B08B 15/02 454/63 |
| 2011/0083824 | A1 * | 4/2011 | Rogers | H05K 7/20745 165/80.2 |
| 2011/0275307 | A1 * | 11/2011 | McIver | F24F 7/02 454/367 |
| 2011/0290553 | A1 * | 12/2011 | Behrens | H05K 7/1488 174/547 |
| 2012/0083197 | A1 * | 4/2012 | Rodriguez | H05K 7/20745 454/184 |
| 2012/0190289 | A1 | 7/2012 | Wei et al. | |
| 2012/0258654 | A1 * | 10/2012 | Peng | H05K 7/20745 454/184 |
| 2012/0302150 | A1 * | 11/2012 | Schmitt | H05K 7/20745 454/184 |
| 2013/0062037 | A1 * | 3/2013 | Rodriguez | H05K 7/20745 165/96 |
| 2014/0287670 | A1 * | 9/2014 | Lin | H05K 7/20745 454/184 |

FOREIGN PATENT DOCUMENTS

| | | |
|---|---|---|
| TW | I294509 B | 3/2008 |
| TW | 201233314 A1 | 8/2012 |

\* cited by examiner

CONTAINER DATA CENTER

BACKGROUND

1. Technical Field

The present disclosure relates to a container data center.

2. Description of Related Art

In a warehouse computing facility, a plurality of container data centers can be stored in the room for data centralization. Each container data center includes a container and a plurality of cabinets received in the container. Each cabinet includes a number of servers generating a great amount of heat during operation. The heat needs to be dissipated timely to ensure the proper functioning of the container data centers. Conventionally, the room includes a sidewall defining a plurality of openings. A first end wall of each container defines an air inlet opposite to the openings of the room, and a second end wall of the container defines an air outlet. Air enters the room through the openings, and flows into the containers through the air inlets, to cool the servers of the cabinets. However, a space is defined between the first end wall of each container and the sidewall of the room, the heat dissipated to the interior of the room easily flows back into the container data centers through the spaces.

BRIEF DESCRIPTION OF THE DRAWINGS

Many aspects of the embodiments can be better understood with reference to the drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
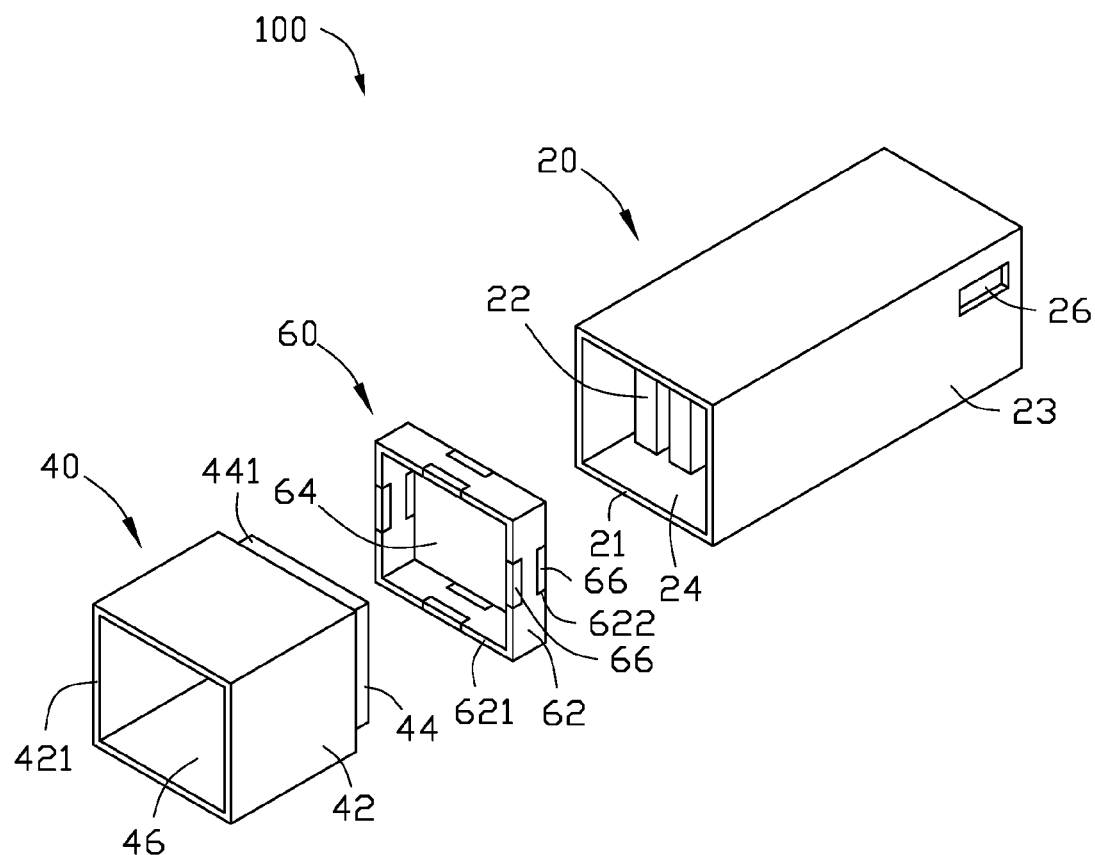
FIG. 1 is an exploded, isometric view of a first exemplary embodiment of a container data center.

FIG. 1 shows a first embodiment of a container data center 100 including a container 20, an air duct 40, and a connecting member 60.

The container 20 includes an end wall 21 defining an air inlet 24 at an end of the container 20, and a sidewall 23 defining an air outlet 26 away from the air inlet 24. A plurality of cabinets 22 is received in the container 20. The container 20 is made of iron.

The air duct 40 includes a rectangular shell 42 and a connecting portion 44. The shell 42 includes four plates 421 connected end to end, and the plates 421 cooperatively bound an airflow channel 46. The connecting portion 44 includes four flanges 441 extending out from corresponding ends of the plates 421. In the embodiment, the air duct 40 is made of iron.

The connecting member 60 includes a rectangular bracket 62 and a plurality of magnets 66. The bracket 62 includes four connecting bars 621 connected end to end, and the connecting bars 621 cooperatively bound a space 64. Two opposite sides of each connecting bar 621 defines two cutouts 622. The magnets 66 are engaged in the cutouts 622 of the connecting bars 621. In the embodiment, the bracket 62 is made of a flexible material, such as a pliable plastic.

Figure 2:
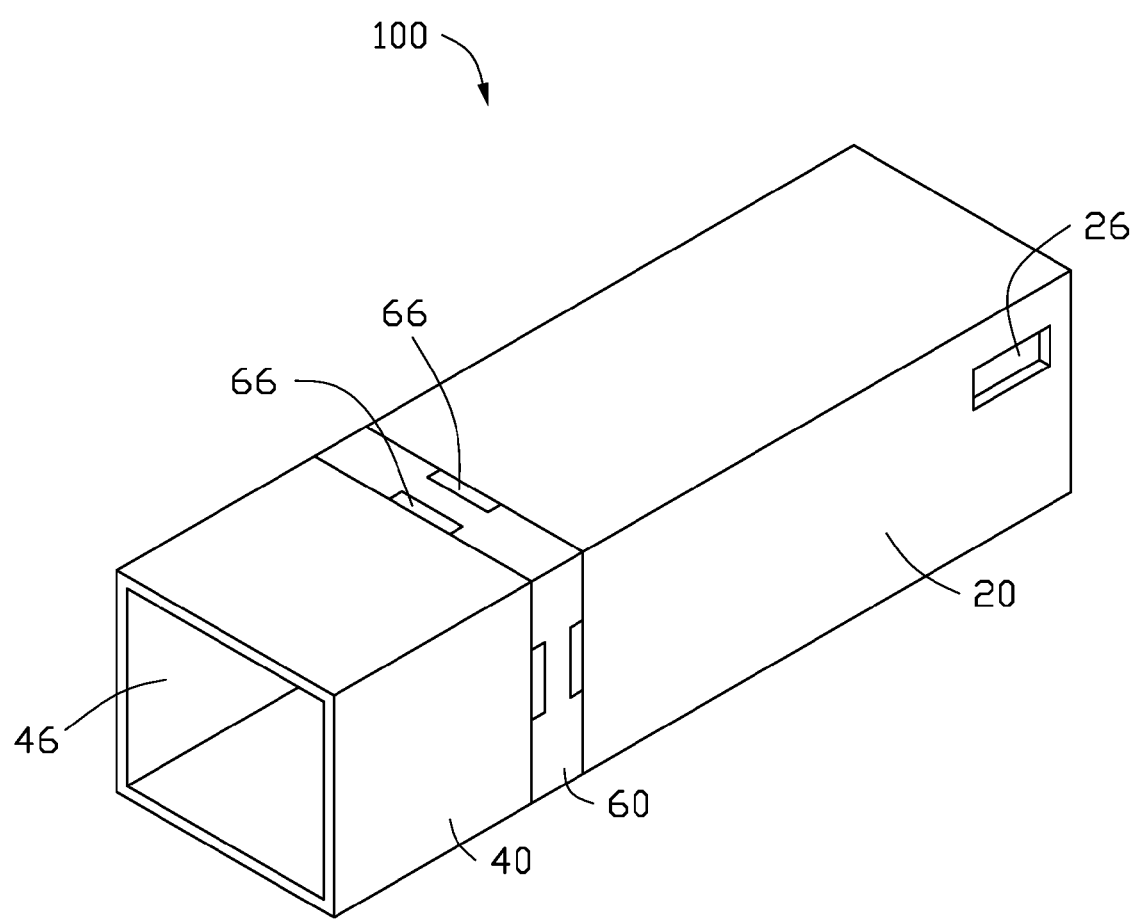
FIG. 2 is an assembled, isometric view of the container data center of FIG. 1.

Referring to FIG. 2, in assembly, the connecting portion 44 of the air duct 40 is inserted into the space 64 of the connecting member 60. The air duct 40 is detachably attracted by the magnets 66 of one side of the bracket 62, and the other side of the bracket 62 is engaged with the end wall 21 of the container 20, to allow the magnets 66 of the other side of the bracket 62 to stick to the end wall 21. Therefore, the connecting member 60 is detachably mounted to the container 20. The airflow channel 46 communicates with the space 64 of the connecting member 60 and the air inlet 24 of the container 20.

Figure 3:
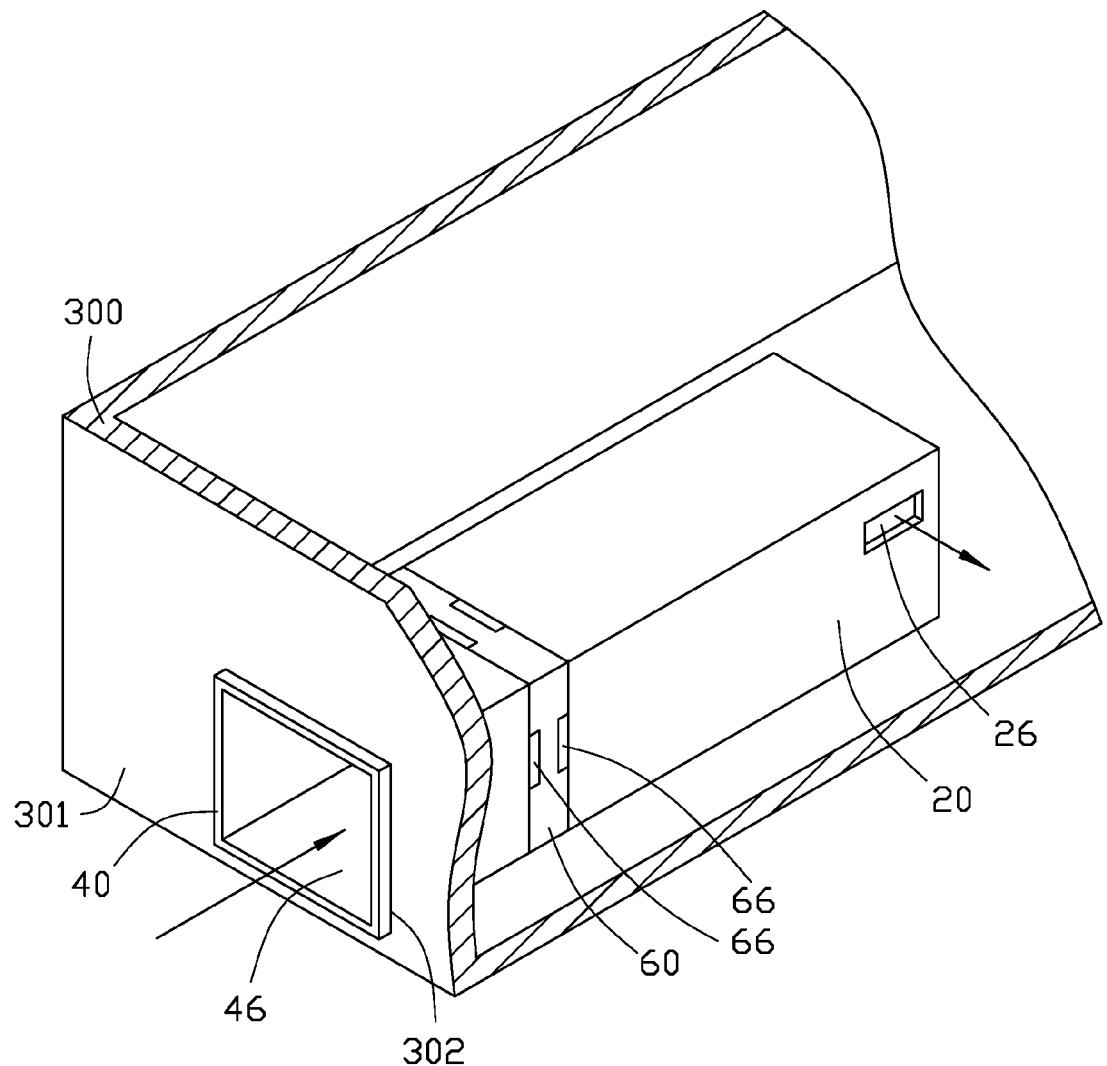
FIG. 3 shows the container data center of FIG. 2 being received in a room.

Referring to FIG. 3, in use, a combination of the container 20, the connecting member 60, and the air duct 40 is received in a room 300. The room 300 includes a sidewall 301 defining a through hole 302. An end of the shell 42 opposite to the connecting member 60 is inserted into the through hole 302 from the interior of the room 300. Air outside the room 300 flows through the airflow channel 46, the space 64, and the air inlet 24, and enters the container 20. Most heat generated in the cabinets 22 is dissipated out of the container 20 through the air outlet 26. The bracket 62 is tightly sandwiched between the air duct 40 and the container 20, so the heat cannot flow back into the container 20.

Figure 4:
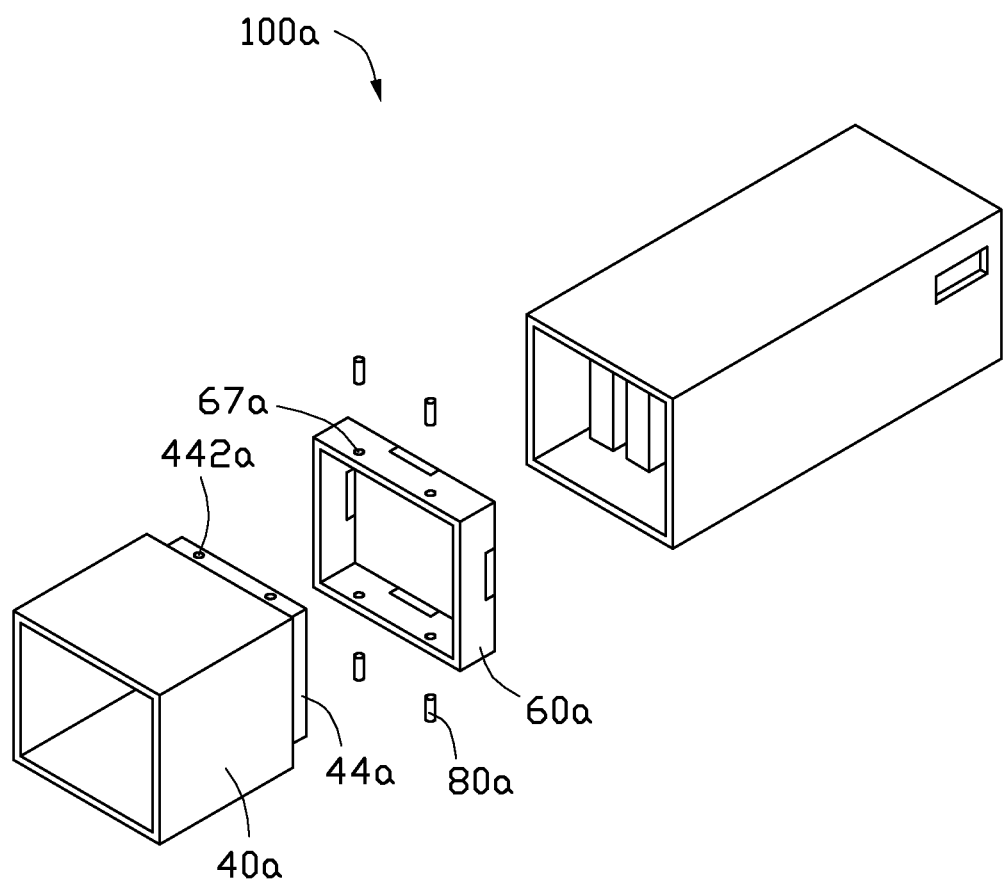
FIG. 4 is an exploded, isometric view of a second exemplary embodiment of a container data center.
Figure 5:
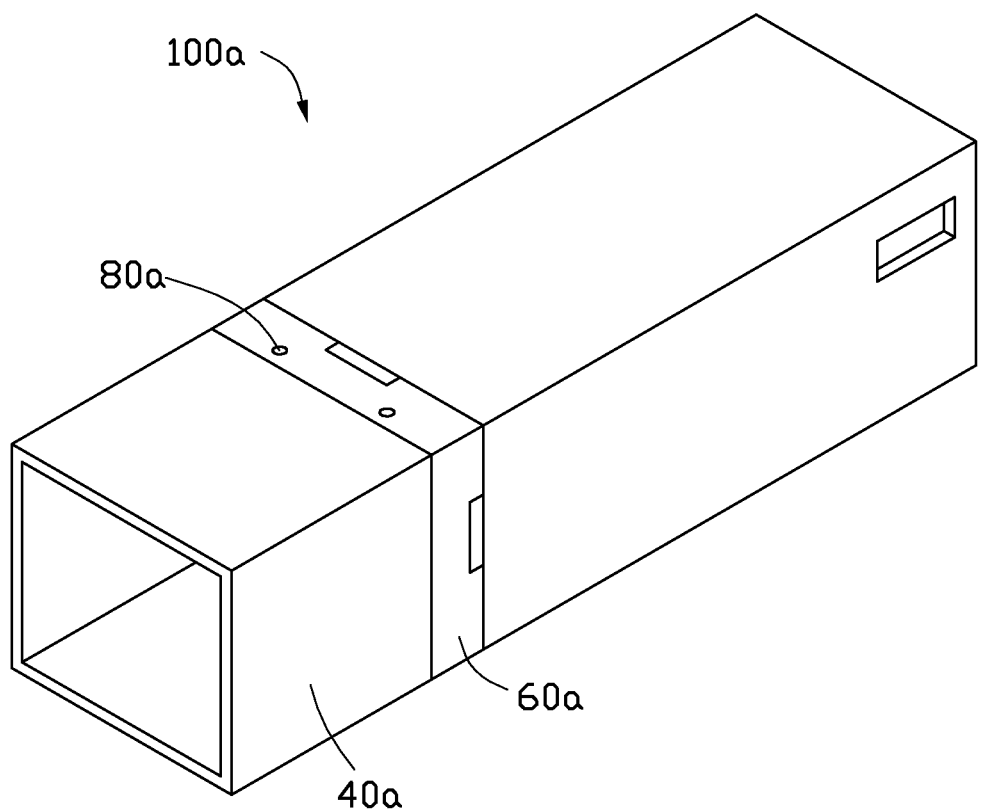
FIG. 5 is an assembled, isometric view of the container data center of FIG. 4.

FIGS. 4-5 show a second embodiment of a container data center 100a substantially similar to the first embodiment of the container data center 100. The container data center 100a includes an air duct 40a and a connecting member 60a. The air duct 40a includes a connecting portion 44a extending out from an end of the air duct 40a. The connecting portion 44a defines a plurality of connecting holes 442a, and the connecting member 60a defines a plurality of positioning holes 67a. The connecting portion 44a is inserted into the connecting member 60a, to allow the connecting holes 442a to align with the positioning holes 67a. A plurality of rivets 80a is installed in the positioning hole 67a and the corresponding connecting hole 442a.

While the disclosure describes examples and embodiments, it is to be understood that the disclosure is not limited thereto. On the contrary, the disclosure is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A container data center received in a room, comprising:
   a container;
   an air inlet defined at an end of the container and an air outlet away from the air inlet, the air outlet positioned across from the air inlet;
   a plurality of server cabinets positioned inside the container;
   an air duct positioned inside the room and extending through a sidewall of the room; and
   a hollow connecting member comprising a first side detachably connected to the end of the container defining the air inlet and a second side opposite to the first side, the second side detachably connected to an end of the air duct away from the sidewall; and wherein air outside the room flows through the air duct, the hollow connecting member, the air inlet, and enters the cabinets dissipating heat generated in the cabinets by flowing out of the container through the air outlet of the container;

wherein the hollow connecting member comprises a bracket sandwiched between the container and the air duct, the bracket defines a space communicating with the air duct and the air inlet of the container;

wherein the bracket comprises four connecting bars connected end to end, and the connecting bars cooperatively bound the space, and wherein the second side of the hollow connecting member comprises a second side of each connecting bar, the second side of each connecting bar defines a cutout, wherein a magnet is engaged in the cutout, the air duct is made of iron, and the air duct is detachably connected to the second side of the bracket through the magnets.

2. The container data center of claim 1, wherein the bracket is made of a flexible material.

3. The container data center of claim 1, wherein the first side of the hollow connecting member comprises a first side of each connecting bar, the first side of each connecting bar defines a cutout, wherein a magnet is engaged in the cutout, and the magnets are coupled to the container at the air inlet.

4. The container data center of claim 1, wherein the air duct comprises a shell and a connecting portion extending out from an end of the shell, the connecting portion is inserted into the space of the bracket, the air duct defines an airflow channel extending through the connecting portion, the airflow channel communicates with the space of the hollow connecting member and the air inlet of the container.

5. The container data center of claim 4, wherein the shell comprises four plates connected end to end, and the plates cooperatively bound the airflow channel.

6. The container data center of claim 4, wherein the connecting portion comprises four flanges extending out from ends of the plates, the flanges are engaged in the space.

7. The container data center of claim 4, wherein the connecting portion defines a plurality of connecting holes, a second side of the bracket defines a plurality of positioning holes aligning with the connecting holes, a plurality of rivets is engaged in the positioning holes and the corresponding connecting holes.

\* \* \* \* \*